United States Patent
Camillo-Castillo et al.

(10) Patent No.: US 9,318,551 B2
(45) Date of Patent: Apr. 19, 2016

(54) TRENCH ISOLATION STRUCTURES AND METHODS FOR BIPOLAR JUNCTION TRANSISTORS

(71) Applicant: GLOBALFOUNDRIES INC., Grand Cayman (KY)

(72) Inventors: Renata Camillo-Castillo, Essex Junction, VT (US); Marwan H. Khater, Astoria, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/527,042

(22) Filed: Oct. 29, 2014

(65) Prior Publication Data

US 2015/0060950 A1 Mar. 5, 2015

Related U.S. Application Data

(62) Division of application No. 13/874,614, filed on May 1, 2013, now Pat. No. 8,975,146.

(51) Int. Cl.
| | |
|---|---|
| *H01L 29/06* | (2006.01) |
| *H01L 29/66* | (2006.01) |
| *H01L 29/732* | (2006.01) |
| *H01L 29/735* | (2006.01) |

(Continued)

(52) U.S. Cl.
CPC ........ *H01L 29/0653* (2013.01); *H01L 29/0649* (2013.01); *H01L 29/66272* (2013.01); *H01L 29/66287* (2013.01); *H01L 29/732* (2013.01); *H01L 29/735* (2013.01); *H01L 29/737* (2013.01); *H01L 29/7325* (2013.01)

(58) Field of Classification Search
CPC ...................... H01L 29/0653; H01L 29/66287; H01L 29/732; H01L 29/0649; H01L 29/735; H01L 29/737; H01L 29/66272; H01L 29/7325; H01L 29/7317; H01L 29/66234; H01L 29/66295; H01L 21/76264; H01L 27/76289
USPC .................................. 257/197, 526, 557, 565
See application file for complete search history.

(56) References Cited

U.S. PATENT DOCUMENTS

| | | | |
|---|---|---|---|
| 5,070,028 A | | 12/1991 | Tews et al. |
| 5,399,511 A | * | 3/1995 | Taka et al. ..................... 438/311 |
| 5,402,002 A | | 3/1995 | Meister et al. |

(Continued)

OTHER PUBLICATIONS

Decoutere et al., "Pushing the speed limits of SiGe:C HBTs up to 0.5 Terahertz", IEEE 2009 Custom Intergrated Circuits Conference (CICC).

(Continued)

*Primary Examiner* — Galina Yushina
(74) *Attorney, Agent, or Firm* — Thompson Hine LLP; Anthony J. Canale

(57) ABSTRACT

Device structures, fabrication methods, and design structures for a bipolar junction transistor. A first isolation region is formed in a substrate to define a lateral boundary for an active device region and an intrinsic base layer is formed on the substrate. The intrinsic base layer has a section overlying the active device region. After the intrinsic base layer is formed, the first isolation region is partially removed adjacent to the active device region to define a trench that is coextensive with the substrate in the active device region and that is coextensive with the first isolation region. The trench is at least partially filled with a dielectric material to define a second isolation region.

13 Claims, 13 Drawing Sheets

(51) Int. Cl.
*H01L 29/737* (2006.01)
*H01L 21/76* (2006.01)

(56) References Cited

U.S. PATENT DOCUMENTS

| | | | |
|---|---|---|---|
| 5,468,659 | A | 11/1995 | Hafizi et al. |
| 6,242,339 | B1 * | 6/2001 | Aoi ............................ 438/623 |
| 6,285,044 | B1 | 9/2001 | Bhat |
| 6,518,145 | B1 | 2/2003 | Alsmeier et al. |
| 6,864,560 | B2 | 3/2005 | Khater et al. |
| 7,190,046 | B2 | 3/2007 | Akatsu et al. |
| 7,342,293 | B2 | 3/2008 | Wallner et al. |
| 7,511,317 | B2 | 3/2009 | Adam et al. |
| 7,538,395 | B2 | 5/2009 | Keena et al. |
| 7,880,270 | B2 | 2/2011 | Heinemann et al. |
| 7,888,745 | B2 | 2/2011 | Khater et al. |
| 7,952,165 | B2 | 5/2011 | Cohen et al. |
| 8,067,290 | B2 | 11/2011 | Boeck et al. |
| 2002/0190351 | A1 | 12/2002 | Freeman et al. |
| 2003/0227071 | A1 * | 12/2003 | Chen ............................ 257/592 |
| 2004/0188797 | A1 | 9/2004 | Khater et al. |
| 2006/0043529 | A1 * | 3/2006 | Chidambarrao et al. ..... 257/565 |
| 2007/0096259 | A1 * | 5/2007 | Akatsu et al. ................. 257/565 |
| 2007/0126080 | A1 | 6/2007 | Wallner et al. |
| 2008/0121937 | A1 * | 5/2008 | Adam ................. H01L 29/7378 257/197 |
| 2009/0065804 | A1 | 3/2009 | Pagette et al. |
| 2010/0327280 | A1 * | 12/2010 | Joseph et al. ................... 257/51 |
| 2012/0146098 | A1 | 6/2012 | Dahlstrom et al. |
| 2014/0151852 | A1 | 6/2014 | Adkisson et al. |

OTHER PUBLICATIONS

Heinemann, et al., "SiGe HBT Technology with fT/fmax of 300GHz/500GHz and 2.0 ps CML Gate Delay", Electron Devices Meeting (IEDM), 2010 IEEE International.

Fox, et al., "Double-polysilicon SiGe HBT architecture with lateral base link", Solid-State Electronics 60 (2011) 93-99.

Notice of Allowance issued in U.S. Appl. No. 13/874,614 dated Oct. 22, 2014.

Office Action issued in U.S. Appl. No. 13/874,614 dated May 29, 2014.

* cited by examiner

US 9,318,551 B2

TRENCH ISOLATION STRUCTURES AND METHODS FOR BIPOLAR JUNCTION TRANSISTORS

BACKGROUND

The present invention relates generally to semiconductor device fabrication and, in particular, to device structures for a bipolar junction transistor, fabrication methods for a bipolar junction transistor, and design structures for a bipolar junction transistor.

Bipolar junction transistors are typically found in demanding types of integrated circuits, especially integrated circuits destined for high-frequency applications and high-power applications. One specific application for bipolar junction transistors is in radiofrequency integrated circuits (RFICs), which are found in wireless communications systems, power amplifiers in cellular telephones, and other varieties of high-speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

Conventional bipolar junction transistors constitute three-terminal electronic devices constituted by three semiconductor regions, namely an emitter, a base, and a collector. An NPN bipolar junction transistor includes two regions of n-type semiconductor material constituting the emitter and collector, and a region of p-type semiconductor material sandwiched between the two regions of n-type semiconductor material to constitute the base. A PNP bipolar junction transistor has two regions of p-type semiconductor material constituting the emitter and collector, and a region of n-type semiconductor material sandwiched between two regions of p-type semiconductor material to constitute the base. Generally, the differing conductivity types of the emitter, base, and collector form a pair of p-n junctions, namely a collector-base junction and an emitter-base junction. A voltage applied across the emitter-base junction of a bipolar junction transistor controls the movement of charge carriers that produce charge flow between the collector and emitter regions of the bipolar junction transistor.

Improved device structures, fabrication methods, and design structures are needed that enhance the device performance of bipolar junction transistors.

BRIEF SUMMARY

In an embodiment of the invention, a method is provided for fabricating a bipolar junction transistor. The method includes forming a first isolation region in a substrate to define a lateral boundary for an active device region and forming an intrinsic base layer on the substrate. The intrinsic base layer has a section overlying the active device region. After the intrinsic base layer is formed, the first isolation region is partially removed adjacent to the active device region to define a trench that is coextensive with the substrate in the active device region and that is coextensive with the first isolation region. The method further includes at least partially filling the trench with a dielectric material to define a second isolation region.

In an embodiment of the invention, a device structure is provided for a bipolar junction transistor. The device structure includes a first isolation region defining a boundary of an active device region in the substrate, an intrinsic base on the active device region of the substrate, a collector in the active device region of the substrate, an emitter coupled by the intrinsic base with the collector, and a second isolation region at least partially inside the first isolation region. The second isolation region is coextensive with the first isolation region and is coextensive with the active device region of the substrate.

In an embodiment of the invention, a hardware description language (HDL) design structure is encoded on a machine-readable data storage medium. The HDL design structure comprises elements that, when processed in a computer-aided design system, generates a machine-executable representation of a bipolar junction transistor. The HDL design structure includes a first isolation region defining a boundary of an active device region in a substrate, an intrinsic base on the active device region of the substrate, a collector in the active device region of the substrate, an emitter coupled by the intrinsic base with the collector, and a second isolation region at least partially inside the first isolation region. The second isolation region is coextensive with the first isolation region and is coextensive with the active device region of the substrate. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
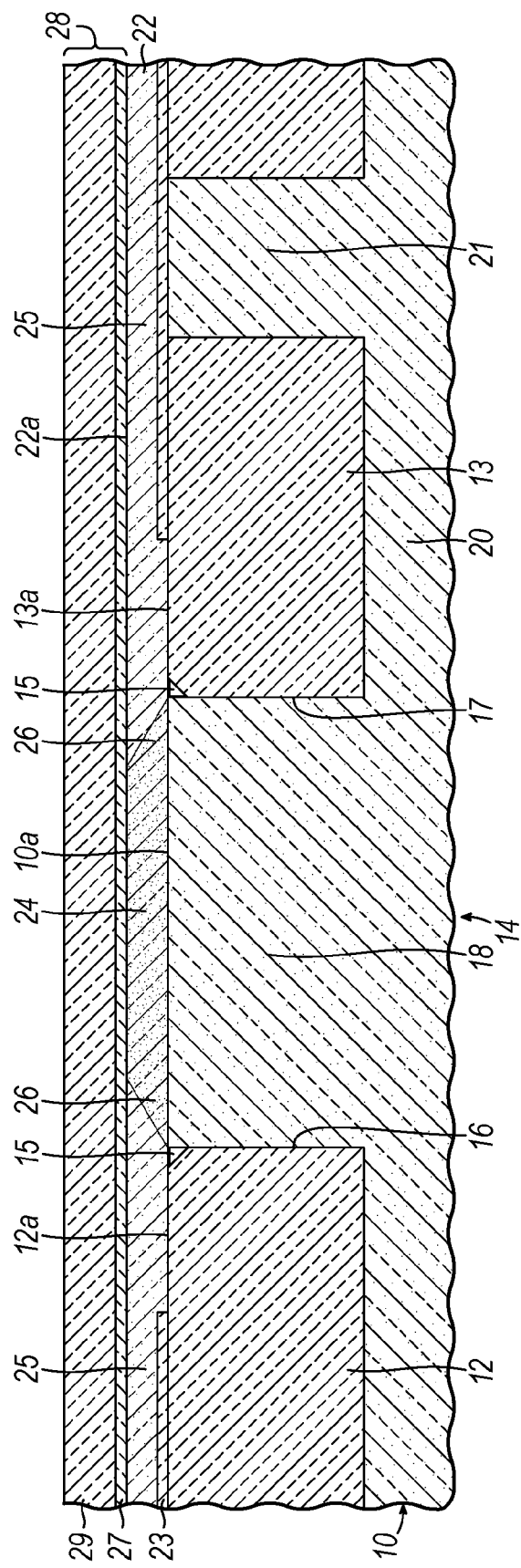
FIGS. 1-8 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 may be any suitable bulk substrate comprising a semiconductor material that a person having ordinary skill in the art would recognize as suitable for forming an integrated circuit. For example, substrate 10 may be comprised of a wafer of a single crystal silicon-containing material, such as single crystal silicon with a (100) crystal lattice orientation. The semiconductor material comprising substrate 10 may be lightly doped with an impurity to alter its electrical properties and may also include an optional epitaxial layer.

Figure 8:
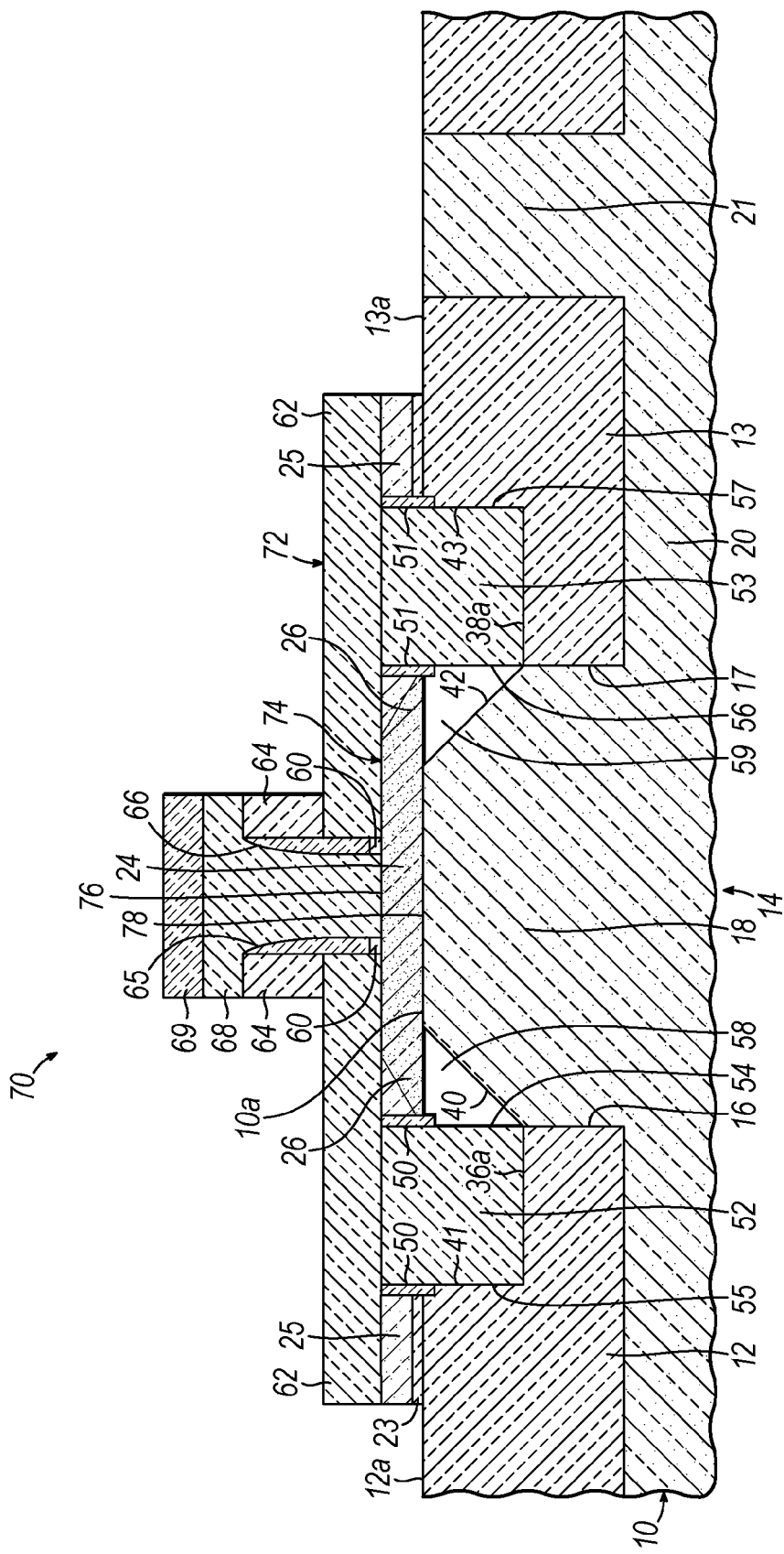

Trench isolation regions 12, 13 that surround and electrically isolate an active device region 14 of the substrate 10, which is used in the fabrication of a bipolar junction transistor 70 (FIG. 8). The trench isolation regions 12, 13 may be formed in the substrate 10 by a shallow trench isolation (STI) technique that deposits a hardmask, define trenches in hardmask and substrate 10 with lithography and dry etching processes, deposits an electrical insulator to fill the trenches, planarizes the electrical insulator relative to the hardmask using a chemical mechanical polishing (CMP) process, and removes the hardmask. The electrical insulator constituting the trench isolation regions 12, 13 may be comprised of an oxide of silicon (e.g., silicon dioxide ($SiO_2$)) deposited by chemical vapor deposition (CVD).

The trench isolation regions 12, 13 are coextensive with the active device region 14 along respective vertical interfaces 16, 17, which are nominally co-planar with sidewalls of the trenches used to form the trench isolation regions 12, 13 and define respective lateral boundaries of the active device region 14. Corners of the trench isolation regions 12, 13 and active device region 14 adjoin at the top surface 10a and are aligned with the vertical interfaces 16, 17.

The trench isolation regions 12, 13 have respective top surfaces 12a, 13a that may be nominally coplanar with the top surface 10a of the substrate 10 in the active device region 14. Divots 15 appear in the trench isolation regions 12, 13 proximate to the corners and alter the planarity of the top surfaces 12a, 13a. The divots 15 operate to reduce the degree of planarity between the top surface 10a and the top surfaces 12a, 13a.

A collector 18 is disposed in the active device region 14 and a subcollector 20 is disposed in the substrate 10 beneath the collector 18. The collector 18 and subcollector 20 are constituted by doped regions of semiconductor material having the same conductivity type. A top surface of the collector 18 may be coextensive with the top surface 10a of the substrate 10 in active device region 14. The collector 18 is positioned interior of the trench isolation regions 12, 13. The subcollector 20 extends from the collector 18 beneath the trench isolation regions 12, 13 to a reach-through region 21 that is exterior of the trench isolation regions 12, 13. The reach-through region 21 facilitates the establishment of external electrical contact with the collector 18 and subcollector 20. The collector 18 and subcollector 20 may comprise an electrically-active dopant, such as an n-type impurity species from Group V of the Periodic Table (e.g., phosphorus (P), arsenic (As), or antimony (Sb)) that is effective to impart n-type conductivity in silicon.

An intrinsic base layer 22 is formed as a continuous additive layer on the top surface 10a of the substrate 10 in active device region 14. The intrinsic base layer 22 is coupled with the collector 18 and may directly contact the collector 18. A patterned screen layer 23 may be applied and opened proximate to the active device region 14. The patterned screen layer 23, which may be comprised of $SiO_2$, covers the top surface 10a at the reach-through region 21.

The intrinsic base layer 22 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 22 may be uniform or the germanium content of intrinsic base layer 22 may be graded and/or stepped across the thickness of intrinsic base layer 22. If the germanium content is stepped, a thickness of the intrinsic base layer 22, such as thicknesses directly contacting the collector 18 or directly adjacent to the substrate 10, may lack germanium and may instead be entirely comprised of silicon. The intrinsic base layer 22 may be doped with one or more impurity species, such as boron, and may further include carbon to suppress the outdiffusion of the impurity species.

Intrinsic base layer 22 may be formed using an epitaxial growth process, such as vapor phase epitaxy. Single crystal semiconductor material (e.g., single crystal silicon and/or single crystal silicon-germanium) is epitaxially grown in a section of intrinsic base layer 22 on the top surface 10a of the substrate 10 in active device region 14. The single-crystal semiconductor material of the active device region 14 serves as a crystalline template for the growth of the single crystal section 24 of intrinsic base layer 22 that is coextensive with the active device region 14.

The intrinsic base layer 22 further includes facets 26 that, in the representative embodiment, surround the single crystal section 24 and a field section 25. Due to the growth process, the single crystal section 24 is aligned with the active device region 14 and the collector 18 in the active device region 14. The facets 26 terminate at a location nominally coinciding with (i.e., coterminous with) the vertical interfaces 16, 17 respectively between the trench isolation regions 12, 13 and active device region 14 and represent a transition to the field section 25 of intrinsic base layer 22. The facets 26 of intrinsic base layer 22 may be a comprised of a mixture of polycrystalline and single crystal semiconductor material. In contrast to the single crystal section 24 and facets 26, the field section 25 of intrinsic base layer 22 is typically comprised of polycrystalline semiconductor material that may be discontinuous and non-uniform.

A hardmask 28 is formed on a top surface 22a of the intrinsic base layer 22. In the representative embodiment, the hardmask 28 is comprised of a layered combination of materials, such as a layer 29 of silicon nitride ($Si_3N_4$) and a thinner layer 27 of $SiO_2$ between the $Si_3N_4$ layer and the top surface 22a of the intrinsic base layer 22. The materials of layers 27, 29, which may be formed by wet or dry thermal oxidation, CVD, or a combination of these processes, may be selected to etch selectively to the semiconductor material of intrinsic base layer 22 and to be readily removed at a subsequent fabrication stage.

Figure 2:
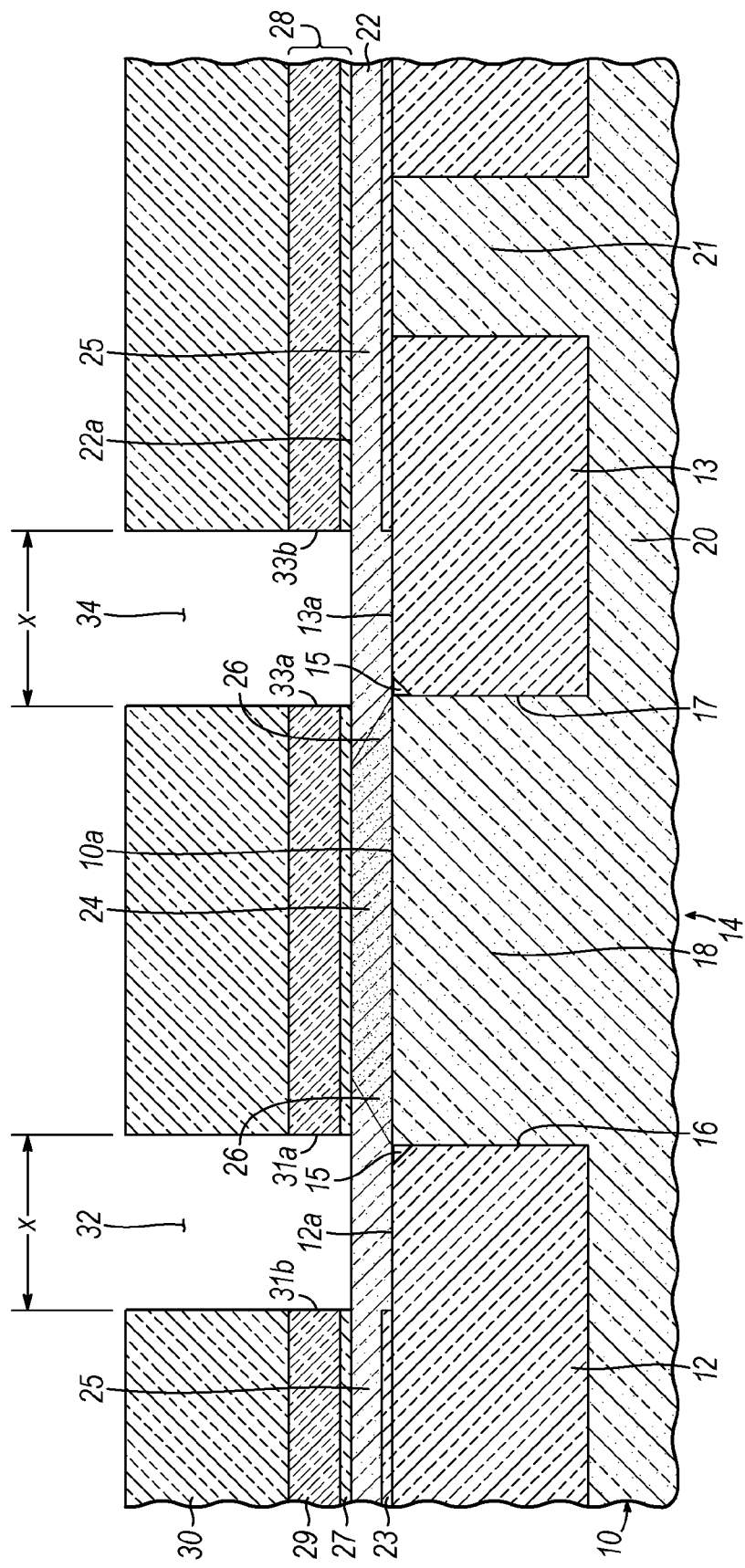

With reference to FIG. 2 in which like reference numerals refer to like features in FIG. 1 and at a subsequent fabrication stage of the processing method, a mask layer 30 is applied on the top surface of the hardmask 28 and used to pattern the hardmask 28. The mask layer 30 may comprise a photoresist that is applied with a spin coating process, pre-baked, exposed to a radiation projected through a photomask, baked after exposure, and developed with a chemical developer to define a pattern with openings 32, 34 coinciding with the intended locations of trenches extending through the intrinsic base layer 22 and into the trench isolation regions 12, 13. The openings 32, 34 may be transferred by one or more etching processes from the mask layer 30 to the layers 27, 29 of hardmask 28 and stopping on the material of the intrinsic base layer 22. Each etching process may rely on a given etch chemistry, and each etching process may comprise a wet chemical etch or a dry etch.

The openings 32, 34 in the hardmask 28 and mask layer 30 have inner sidewalls 31a, 33a, which may be laterally located with reference to the respective vertical interfaces 16, 17 along which the trench isolation regions 12, 13 and active device region 14 are coextensive. In one embodiment, the inner sidewall 31a of opening 32 may be coplanar with the vertical interface 16, and the inner sidewall 33a of opening 34 may be coplanar with the vertical interface 17. The location of the inner sidewalls 31a, 33a may be moved by adjusting the width, x, of the openings 32, 34 in the mask layer 30. For example, the width, x, may be increased to shift the inner sidewalls 31a, 33a inwardly so that the inner sidewalls 31a, 33a are located inside the vertical interfaces 16, 17. Alternatively, the width, x, may be maintained constant by shifting the location of the outer sidewalls 31b, 33b inward as the inner sidewalls 31a, 33a are shifted inward. Alternatively, the openings 32, 34 may have different widths and the distance from the inner sidewall 31a to vertical interface 16 may differ from the distance from the inner sidewall 33a to vertical interface 17. The divots 15 in the trench isolation regions 12, 13 may be exposed within the openings 32, 34 and therefore not covered by the hardmask 28.

The mask layer 30 is removed after the openings 32, 34 are extended into the hardmask 28, followed by a cleaning process. If comprised of a photoresist, the mask layer 30 may then be removed by ashing or solvent stripping.

Figure 3:
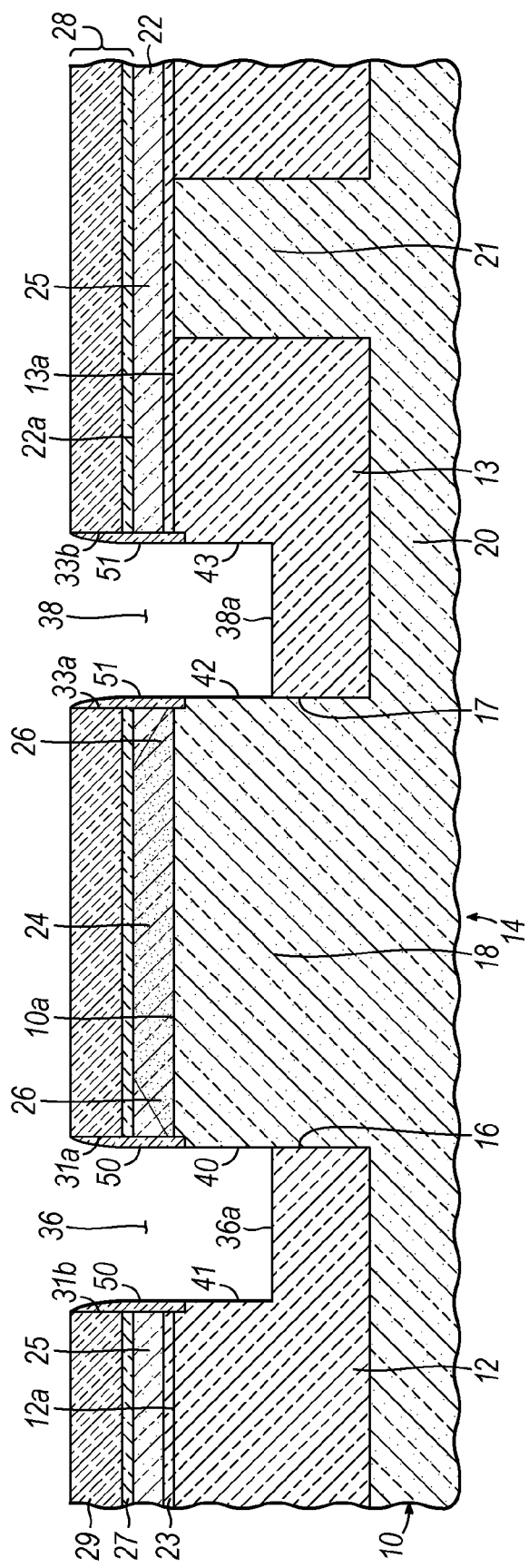

With reference to FIG. 3 in which like reference numerals refer to like features in FIG. 2 and at a subsequent fabrication stage of the processing method, trenches 36, 38 are formed using the patterned hardmask 28 as an etch mask. The trenches 36, 38 are aligned with the openings 32, 34 in hardmask 28. An etching process is applied to remove the material of the intrinsic base layer 22 selective to the materials of the hardmask 28 and trench isolation regions 12, 13. For example, the etching process may comprise reactive-ion etching (RIE) that produces sidewalls for the trenches 36, 38 that are nominally perpendicular to the top surface 10a. The openings 32, 34 in the mask layer 30 may be positioned relative to the intrinsic base layer 22 such that a portion of the field section 25 is removed but the single crystal section 24 and the facets 26 of intrinsic base layer 22 remain intact. Alternatively and as discussed above, the openings 32, 34 in the hardmask 28 may be shifted slightly inward so that the facets 26 are partially or completely removed by the formation of the trenches 36, 38.

Dielectric spacers 50, 51 may be formed on the intrinsic base layer 22 and hardmask 28 bordering the trenches 36, 38 by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces. The dielectric spacers 50, 51 may directly contact the respective top surfaces 12a, 13a of the trench isolation regions 12, 13.

The trenches 36, 38 are then respectively extended into the trench isolation regions 12, 13 with an etching process that removes the dielectric material of the trench isolation regions 12, 13 selective to the materials of the hardmask 28, intrinsic base layer 22, substrate 10, and dielectric spacers 50, 51. The etching process may comprise a wet chemical etch or a dry etch. In one embodiment, the etching process may comprise RIE to produce sidewalls 40, 42 bordering the substrate 10 in active device region 14 and sidewalls 41, 43 bordering the trench isolation regions 12, 13 that are nominally vertical relative to the top surface 10a.

The trench isolation regions 12, 13 are only partially removed by the etching process. The trenches 36, 38 penetrate into, but not through, the trench isolation regions 12, 13. To that end, the etching process may be timed to stop before the trenches 36, 38 have advanced completely through the trench isolation regions 12, 13 and into the substrate 10 beneath the trench isolation regions 12, 13. The area of trench 36 is smaller than the area of surface 12a and the area of trench 38 is smaller than the area of surface 13a viewed in a direction normal to the surfaces 12a, 13a. The formation of the trenches 36, 38 may remove the divots 15 from the trench isolation regions 12, 13.

When complete, trenches 36, 38 extend from the top surface 22a of the intrinsic base layer 22 through the intrinsic base layer 22 and into the trench isolation regions 12, 13. The trenches 36, 38 may be connected and surround the perimeter of the active device region 14. Alternatively, the trenches 36, 38 may be disconnected at the ends (not shown) of the active device region 14 in a direction normal to the structure cross-section shown in FIG. 3. Trench 36 includes sidewalls 40, 41 and a base 36a connecting the sidewalls 40, 41. Trench 38 includes sidewalls 42, 43 and a base 38a connecting the sidewalls 42, 43. Sidewall 40 is nominally coplanar with sidewall 31a of opening 32 and with the vertical interface 16. Sidewall 42 is nominally coplanar with sidewall 33a of opening 34 and with the vertical interface 17.

Figure 4:
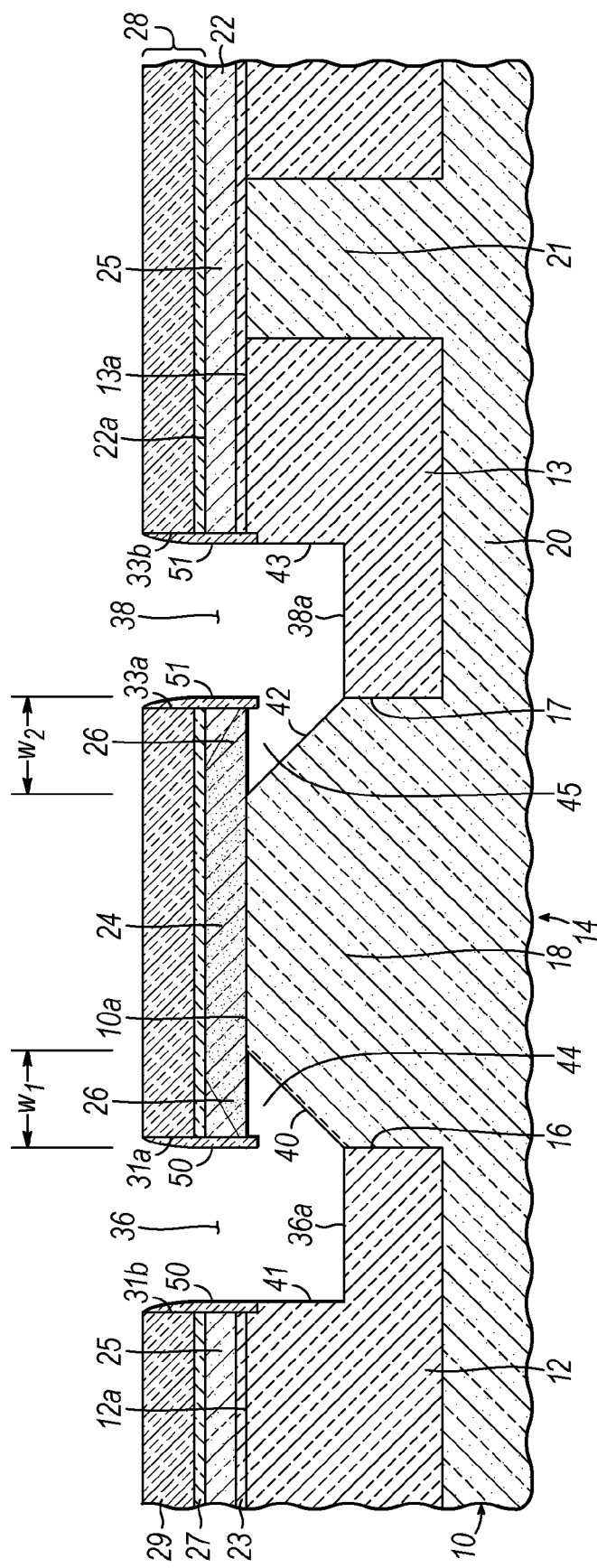

With reference to FIG. 4 in which like reference numerals refer to like features in FIG. 3 and at a subsequent fabrication stage of the processing method, the trenches 36, 38 are modified to laterally recess the sidewalls 40, 42 into the substrate 10 within the active device region 14, which alters the profile of the trenches 36, 38. The altered profile includes lateral extensions 44, 45 that undercut the single crystal section 24 of intrinsic base layer 22. The lateral extension 44 of trench 36 is bounded by the sidewall 40 in substrate 10 within the active device region 14, the bottom surface of the single crystal section 24, and the base 36a. The lateral extension 45 of trench 38 is bounded by the sidewall 42 in substrate 10 within the active device region 14, the bottom surface of the single crystal section 24, and base 38a.

The sidewall 40 is sloped or inclined at an angle relative to the top surface 10a and undercuts the intrinsic base layer 22 beneath the single crystal section 24. The degree of the undercutting can be characterized by a numerical bias or distance, $w_1$, measured between the sidewall 40 and the vertical interface 16. The sidewall 42 of trench 38 is likewise sloped or inclined at an angle relative to the top surface 10a and undercuts the intrinsic base layer 22 beneath the single crystal section 24. The degree of the undercutting can be characterized by a numerical bias or distance, $w_2$, measured between the sidewall 40 and the vertical interface 17.

The undercutting may be uniform and symmetrical, in which instance the lateral extensions 44, 45 may have the same depth, width, and shape and the inclination angles are the same. The symmetrical undercut is tolerant of misalignment of the openings 32, 34 in the hardmask 28 and mask layer 30 (and hence the location of the trenches 36, 38 prior to the etching process providing the undercutting) in that the openings 32, 34 may be asymmetrically positioned relative to the single crystal section 24 of intrinsic base layer 22 and/or have different widths. The undercutting reduces the area of direct contact between the collector 18 and the single crystal section 24 of intrinsic base layer 22.

To provide the lateral extensions 44, 45, the semiconductor material of the substrate 10 may be etched by a wet chemical etching process, a dry etching process, or a combination of wet chemical and dry etching processes selective to the material of the intrinsic base layer 22 and the dielectric materials of the trench isolation regions 12, 13 and the hardmask 28. The profile of the lateral extensions 44, 45 of trenches 36, 38 in active device region 14 may be adjusted to have a specific shape, undercutting angle, undercut distance (i.e., bias), etc. by selecting factors such as the chemistry, duration, etc. of the etching process. The etching process may be combined with implantation damage to the semiconductor material and/or doping of the semiconductor material to alter etch rates and, thereby, the profile. The etching process may further rely on wafer orientation and anisotropic etching processes that exhibit different etch rates for different crystallographic directions (as specified, for example, by Miller indices) in a single-crystal semiconductor material.

Figure 4A:
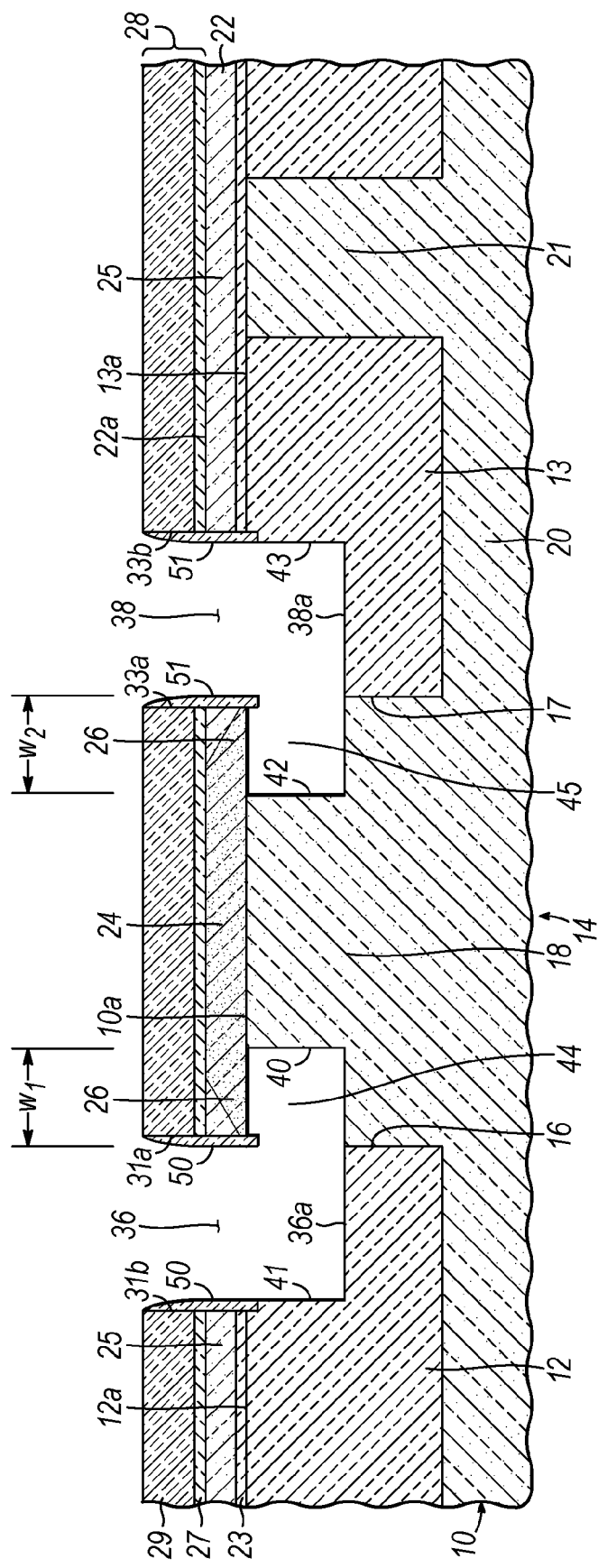
FIGS. 4A, 4B, 4C are a cross-sectional views similar to FIG. 4 in accordance with alternative embodiments of the invention.
Figure 4B:
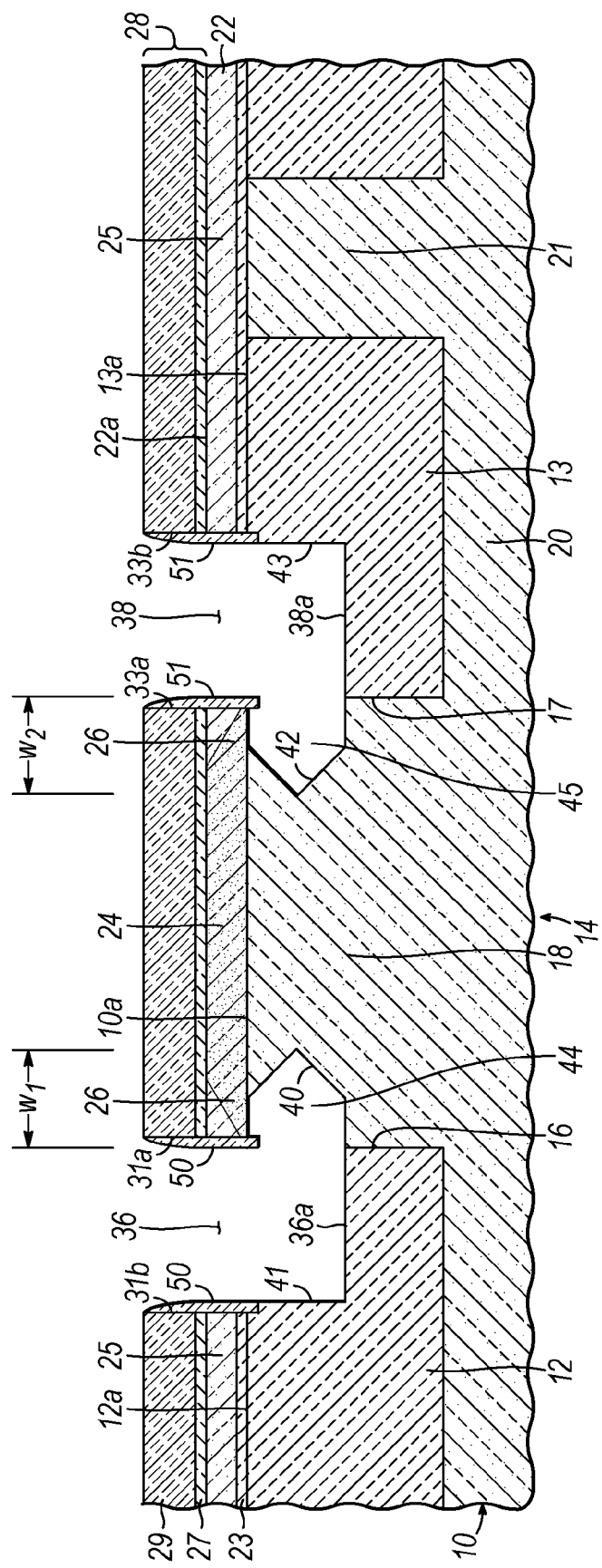
Figure 4C:
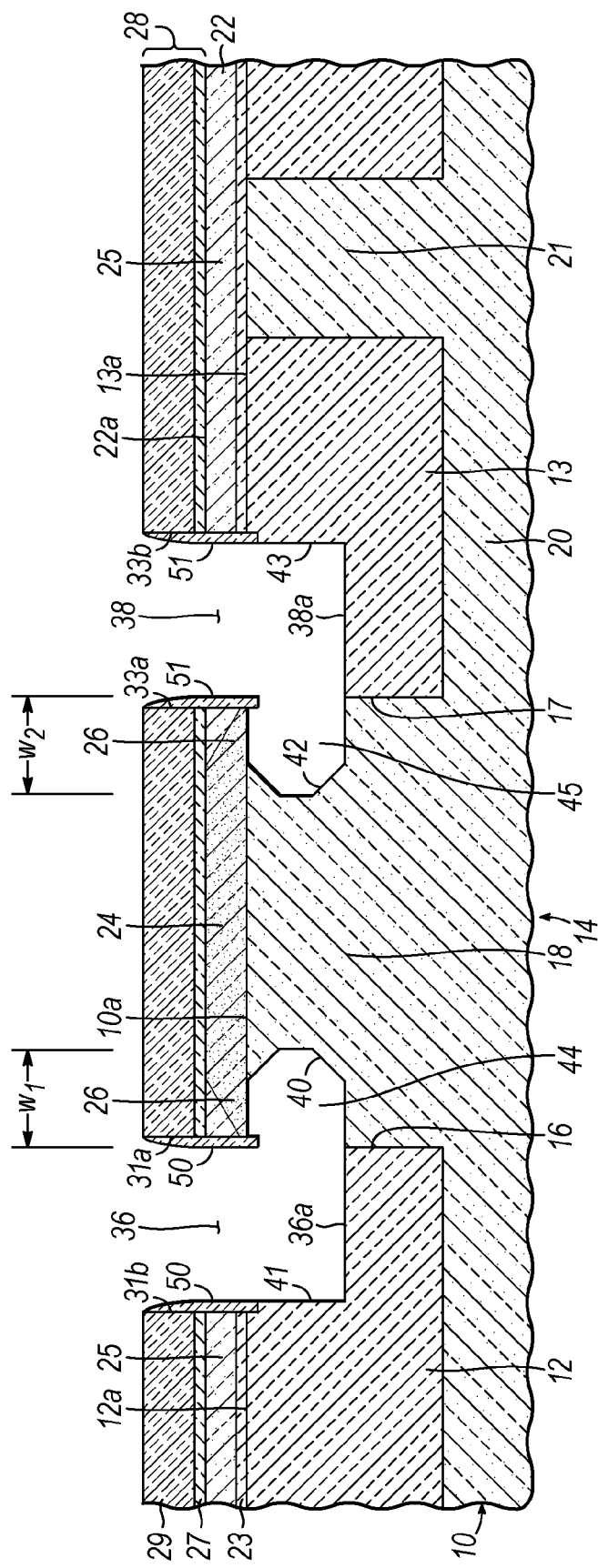

The lateral extensions 44, 45 of trenches 36, 38 may have a different profile than apparent in the representative embodiment of FIG. 4. For example and with reference to FIG. 4A, the etching process may produce lateral extensions 44, 45 that exhibit a box-like or square shape because the sidewalls 40, 42 are displaced inwardly but remain parallel with sidewalls 41, 43. As other examples and with reference to FIGS. 4B, 4C, the etching process may produce sidewalls 40, 42 in the active device region 14 of the substrate 10 that are faceted or beveled with multiple sides and adjacent sides joining at corners. The sidewalls 40, 42 in the lateral extensions 44, 45 may be characterized as non-rectangular polygons, such as triangular-shaped (FIG. 4B) or diamond-shaped (FIG. 4C).

Figure 5:
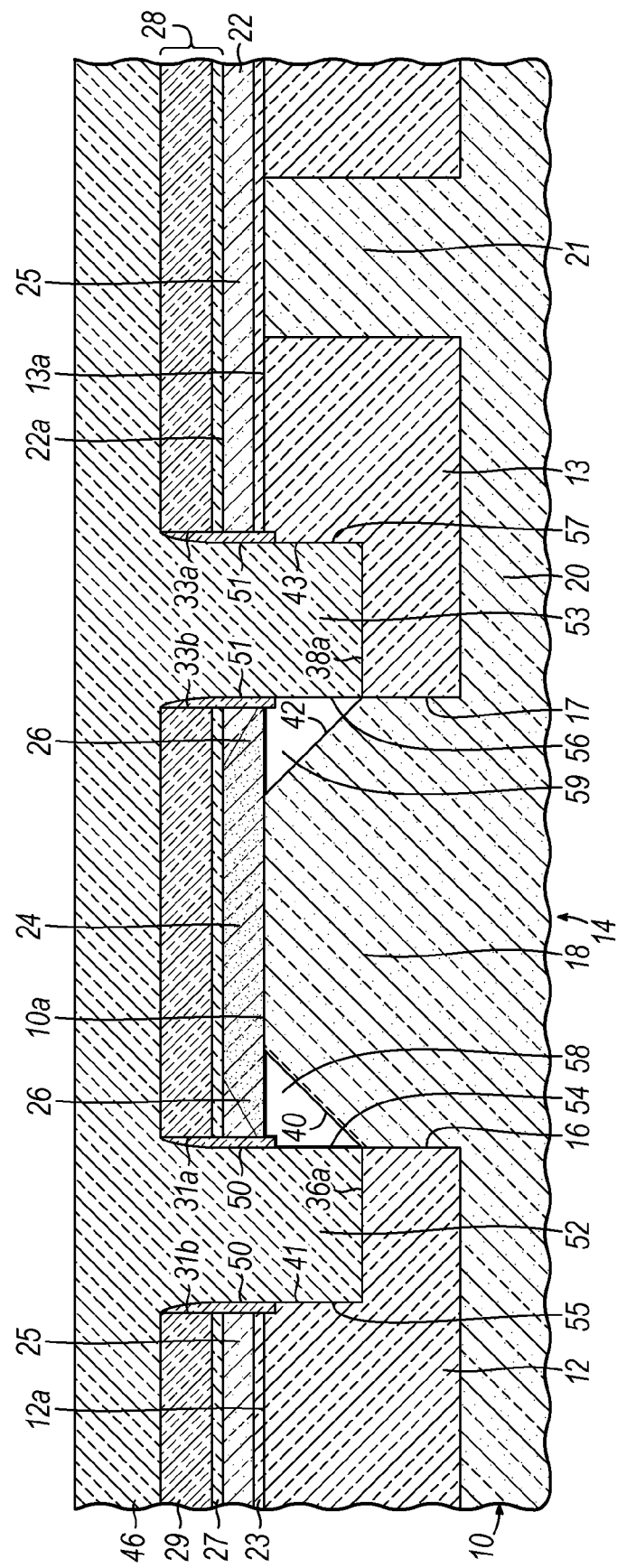

With reference to FIG. 5 in which like reference numerals refer to like features in FIG. 4 and at a subsequent fabrication stage of the processing method, trench isolation regions 52, 53 comprised of an electrical insulator are formed in the trenches 36, 38. To that end, a dielectric layer 46 is deposited that fills the trenches 36, 38 with respective portions of the electrical insulator. Dielectric layer 46 may be deposited by a directional or non-conformal technique such that air gaps 58, 59 are formed in the lateral extensions 44, 45 between the sloped sidewalls 40, 42 and the bottom side of the intrinsic base layer 22. The dielectric material in the trenches 36, 38 closes the lateral extensions 44, 45 to define the air gaps 58, 59. The air gaps 58, 59 each represent empty spaces devoid of dielectric material. The trench isolation regions 52, 53 and air gaps 58, 59 surround the collector 18 and define secondary trench isolation for the active device region 14.

The trench isolation regions 52, 53 and air gaps 58, 59 collectively reproduce the geometrical shape of the trenches 36, 38 and are nominally identical to each other. Trench isolation region 52 includes sidewalls 54, 55 and the air gap 58 is disposed between the sidewall 54 and the active device region 14. Similarly, trench isolation region 53 includes sidewalls 56, 57 and the air gap 59 is disposed between the sidewall 56 and the active device region 14. The trench isolation regions 52, 53 and air gaps 58, 59 surround the collector 18 and define secondary trench isolation for the active device region 14. The trench isolation regions 52, 53 reside in removed sections of the trench isolation regions 12, 13 and are at a shallower depth relative to the top surface 10a than the trench isolation regions 12, 13.

In one embodiment, the dielectric layer 46 may be deposited by plasma-enhanced CVD (PECVD) and, in a more specific embodiment, may be comprised of an oxide of silicon (e.g., $SiO_2$) deposited by PECVD. The air gaps 58, 59 may have an effective dielectric constant of near unity (about 1.0) and may be filled by air at or near atmospheric pressure, filled by another gas at or near atmospheric pressure, or contain air or gas at a sub-atmospheric pressure (e.g., a partial vacuum). In one embodiment, the composite dielectric constant of the dielectric material comprising trench isolation regions 52, 53 and the air gaps 58, 59 may be less than the dielectric constant of the dielectric material comprising trench isolation regions 12, 13.

Figure 7:
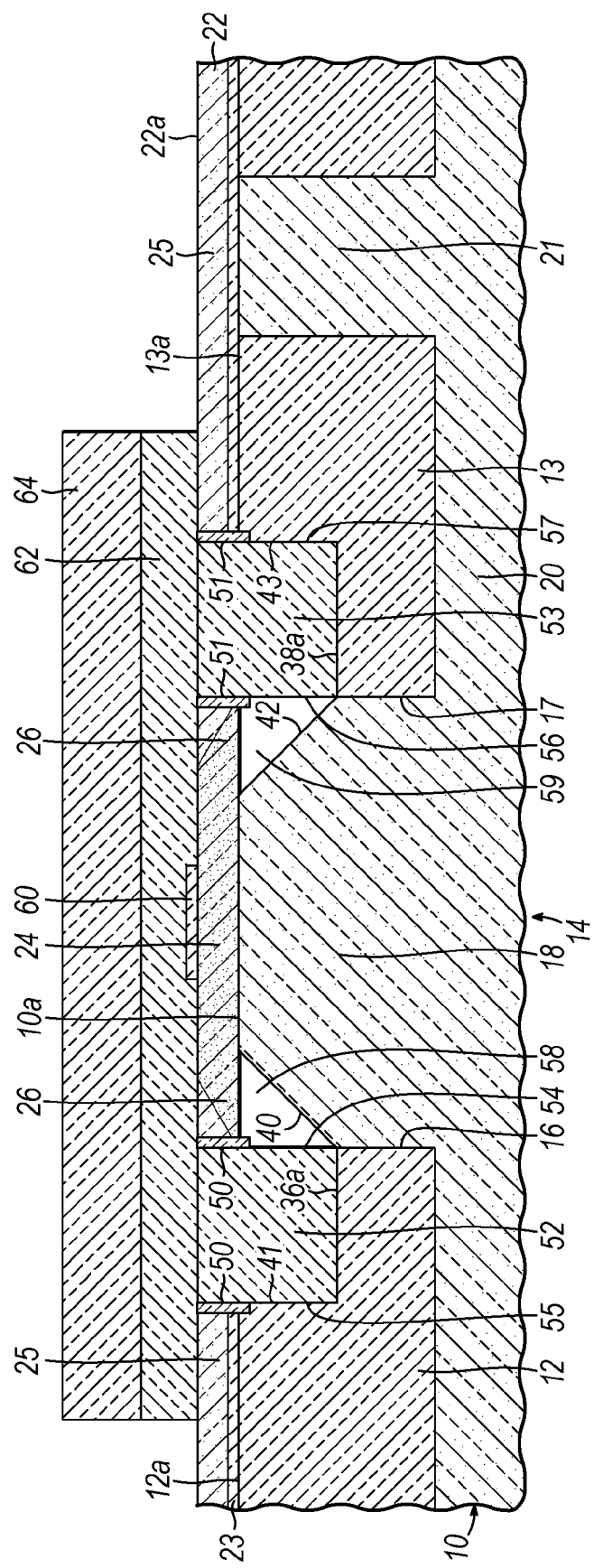

The trench isolation regions 52, 53 include dielectric material at locations proximate to the corners at the juncture of the top surface 10a of the substrate 10 in the active device region 14 and the top surfaces 12a, 13a of the trench isolation regions 12, 13 that would otherwise host divots 15. As discussed above, the divots 15 in the trench isolation regions 12, 13 are removed when the trenches 36, 38 are formed. The dielectric material of the trench isolation regions 52, 53 replaces the divots 15, which improves device planarity and covers the corners of the active device region 14. The elimination of the divots 15 and their replacement with dielectric material may decrease device leakage current and, thereby, may lengthen the life of the bipolar junction transistor 70 (FIG. 7).

The dielectric layer 46 may comprise an organic or inorganic dielectric material, which may be an electrical insulator characterized by an electrical resistivity at room temperature of greater than $10^{10}$ ($\Omega$-m). Candidate inorganic dielectric materials for dielectric layer 46 may include, but are not limited to, silicon dioxide ($SiO_2$), fluorine-doped silicon glass (FSG), and combinations of these dielectric materials. Alternatively, dielectric layer 46 may comprise a low-k dielectric material characterized by a relative permittivity or dielectric constant smaller than the $SiO_2$ dielectric constant of approximately 3.9. Candidate low-k dielectric materials for dielectric layer 46 include, but are not limited to, spun-on organic low-k dielectrics (e.g., spun-on polymer resins) and inorganic low-k dielectrics (e.g., organosilicate glasses, hydrogen-enriched silicon oxycarbide (SiCOH), and carbon-doped oxides), and combinations of these and other organic and inorganic dielectrics.

Figure 5A:
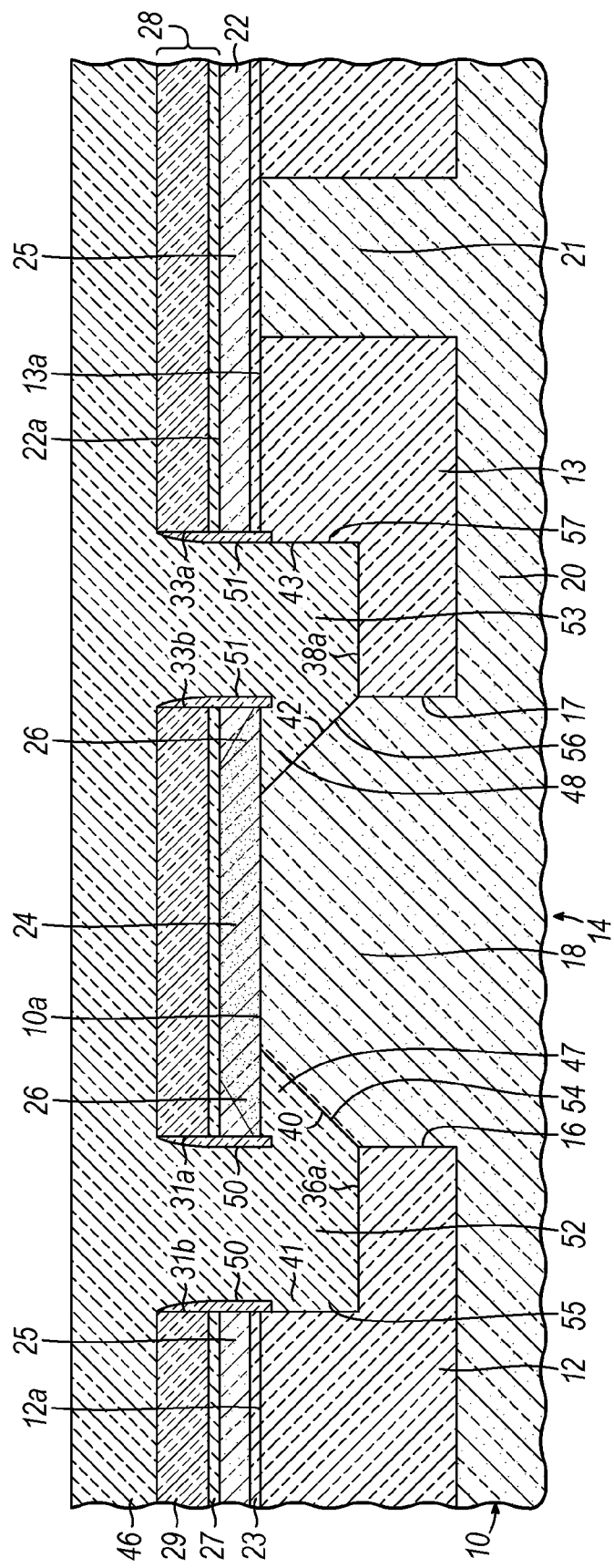
FIG. 5A is a cross-sectional view similar to FIG. 5 in accordance with an alternative embodiment of the invention

With reference to FIG. 5A in which like reference numerals refer to like features in FIG. 5 and in accordance with an alternative embodiment, the dielectric layer 46 may fill the lateral extensions 44, 45 of trenches 36, 38 such that air gaps 58, 59 (FIG. 5) are absent and the trench isolation regions 52, 53 are enlarged. In particular, the trench isolation regions 52, 53 include respective portions 47, 48 of the electrical insulator from dielectric layer 46 in the lateral extensions 44, 45 between the sloped sidewalls 40, 42 of trenches 36, 38 and the bottom side of the intrinsic base layer 22. The sidewall 54 of trench isolation region 52 is shifted to coincide and be coextensive with the sidewall 40 and sidewall 56 of trench isolation region 53 is shifted to coincide and be coextensive with the sidewall 42. The trench isolation regions 52, 53 are partially inside the trench isolation regions 12, 13 and partially inside the active device region 14 of substrate 10. The trench isolation regions 52, 53 and dielectric-filled portions 47, 48 surround the collector 18 and define secondary trench isolation for the active device region 14.

To provide the portions 47, 48 of electrical insulator, the dielectric layer 46 may be deposited by a conformal deposition technique. In one embodiment, the conformal deposition technique used to deposit dielectric layer 46 may be low pressure chemical vapor phase deposition (LPCVD) using a silicon source of either silane or a mixture of silane with nitrogen. In a specific embodiment, the dielectric layer 46 may be comprised of an oxide of silicon (e.g., $SiO_2$) deposited by LPCVD. In one embodiment, the dielectric constant of the dielectric material comprising trench isolation regions 52, 53 may be lower than the dielectric constant of the dielectric material of trench isolation regions 12, 13.

Figure 6:
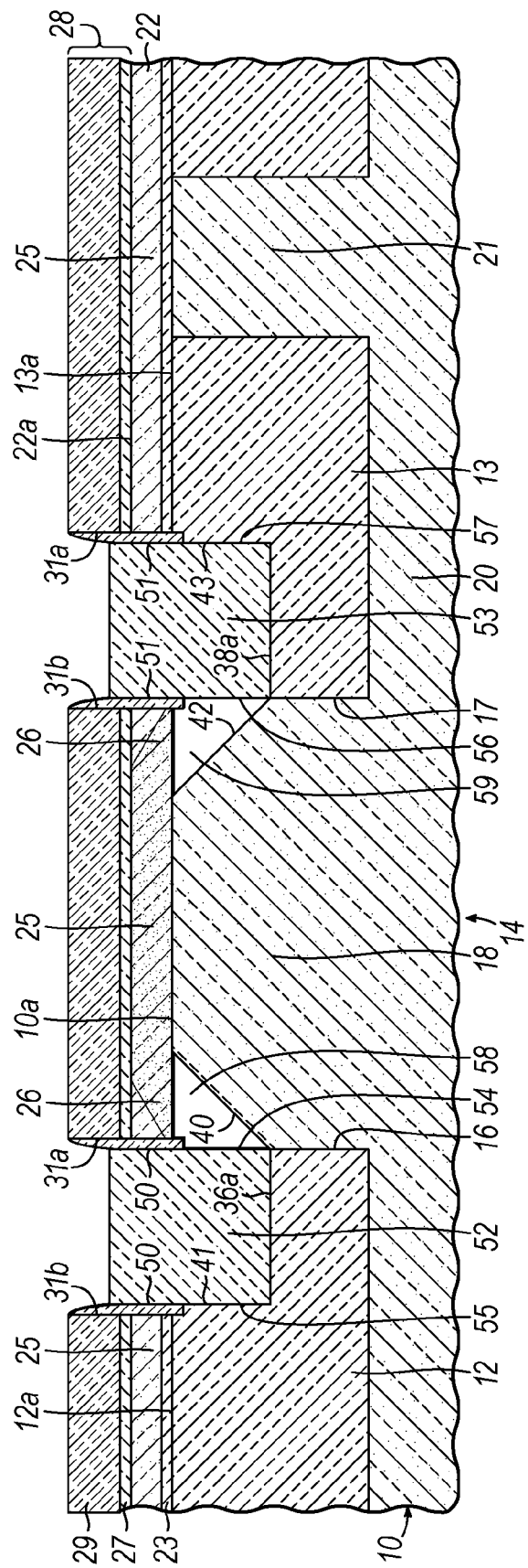

With reference to FIG. 6 in which like reference numerals refer to like features in FIG. 5 and at a subsequent fabrication stage of the processing method, the dielectric layer 46 is removed from hardmask 28, but not from within the trenches 36, 38, by a wet etching process, a dry etching process, polishing, or a combination thereof. If the dielectric layer 46 is comprised of an oxide of silicon, then RIE or an oxide etch (e.g., buffered hydrofluoric acid or diluted hydrofluoric acid) may be employed to remove the dielectric layer 46 selective to the hardmask 28 and spacers 50, 51.

With reference to FIG. 7 in which like reference numerals refer to like features in FIG. 6 and at a subsequent fabrication stage of the processing method, the hardmask 28 is removed by a wet etching process, a dry etching process, or a combination thereof. A dielectric layer 60 is applied and patterned to leave a pad at the intended location for a connection between an emitter and the intrinsic base layer 22. An extrinsic base layer 62 is formed on the top surface 22a of the intrinsic base layer 22. A dielectric layer 64 is then formed on a top surface of the extrinsic base layer 62.

In one embodiment, the extrinsic base layer 62 may be comprised of polycrystalline semiconductor material (e.g., polysilicon or polycrystalline SiGe) deposited by CVD process. If the extrinsic base layer 62 is comprised of SiGe, the concentration of Ge may have a graded or an abrupt profile and may include additional layers, such as a Si cap layer and/or a Si bottom layer. The extrinsic base layer 62 may be in situ doped with a concentration of a dopant, such as an impurity species from Group III of the Periodic Table (e.g., boron) effective to impart p-type conductivity and may be optionally doped with carbon to retard impurity species diffusion. As a consequence of the crystalline state of the single crystal section 24 of intrinsic base layer 22, the extrinsic base layer 62 may be comprised of single crystal semiconductor material that relies on the semiconductor material of the intrinsic base layer 22 as a growth seed. Dielectric layer 64 may be comprised of an electrical insulator, such as $SiO_2$ deposited using CVD.

With reference to FIG. 8 in which like reference numerals refer to like features in FIG. 7 and at a subsequent fabrication stage of the processing method, dielectric layer 64 is patterned using photolithography and etching processes to define an emitter opening aligned with the collector 18. To that end, a patterned etch mask (not shown) is applied to the dielectric layer 64. In one embodiment, the etch mask may be a photoresist layer comprised of a sacrificial organic material applied by spin coating to dielectric layer 64. The photolithography process that patterns the photoresist layer exposes the photoresist to radiation imaged through a photomask and develops the resulting latent feature pattern in the exposed photoresist to define a window at the intended location for the emitter opening. The etching process relies on an etch chemistry effective to remove the material of the dielectric layer 64 exposed within the window and stops on the extrinsic base layer 62. After the opening is formed, the etch mask is removed. An etch mask comprised of photoresist may be removed by oxygen plasma ashing or chemical stripping.

The emitter opening is extended by an etching process, such as RIE, through the thickness of the extrinsic base layer 62 using the patterned dielectric layer 64 as a hardmask. Spacers 65, 66 are formed inside the emitter opening and extend vertically to the base of the emitter opening. The spacers 65, 66 may be formed by depositing a conformal layer comprised of an electrical insulator, such as $Si_3N_4$ deposited by CVD, and shaping the conformal layer with an anisotropic etching process, such as RIE.

The emitter opening is extended through the pad defined by dielectric layer 60 and an emitter 68 of the bipolar junction transistor 70 is then formed inside the emitter opening. The emitter 68 may be formed from a layer comprised of heavily-doped semiconductor material that is deposited and then patterned using photolithography and etching processes. For example, the emitter 68 may be comprised of polysilicon or polycrystalline silicon-germanium deposited by CVD or LPCVD and heavily doped with a concentration of a dopant, such as an impurities species from Group V of the Periodic Table, such as phosphorus (P), arsenic (As), to impart n-type conductivity. The photolithography process may pattern photoresist to form an etch mask that protects only a strip of the semiconductor material registered with the emitter opening. An etching process that stops on the material of dielectric layer 64 is selected to fashion the emitter 68 from the protected strip of semiconductor material. The etch mask is subsequently removed.

The emitter 68 is electrically and physically coupled with the intrinsic base layer 22. The bottom part of the emitter 68 may directly contact the top surface 22a of intrinsic base layer 22. A head of the emitter 68 protrudes out of the emitter opening and may include lateral arms that overlap with the top surface of dielectric layer 64. A cap 69 of a dielectric material may be formed on the head of the emitter 68. The non-conductive spacers 65, 66 encircle or surround the emitter 68 so that the emitter 68 is electrically isolated from the extrinsic base layer 62.

Dielectric layer 64 is lithographically patterned using the same etch mask used to form the emitter 68, and an etching process, such as RIE, with suitable etch chemistries. The etch mask is subsequently removed. The extrinsic base layer 62 and intrinsic base layer 22 are then lithographically patterned with photolithography and etching processes and a different etch mask to respectively define an extrinsic base 72 and an intrinsic base 74 of the bipolar junction transistor 70.

After patterning, the bipolar junction transistor 70 has a vertical architecture in which the intrinsic base 74 is located between the emitter 68 and the collector 18, and the emitter 68, the intrinsic base 74, and the collector 18 are vertically arranged. The conductivity types of the semiconductor material constituting the emitter 68 and the semiconductor materials constituting the intrinsic base 74 are opposite. One junction 76 is defined at the interface between the emitter 68 and the intrinsic base 74. Another junction 78 is defined at the interface between the collector 18 and the intrinsic base 74. The bipolar junction transistor 70 may be characterized as a heterojunction bipolar transistor (HBT) if at least two of the collector 18, emitter 68, and intrinsic base 74 are comprised of differing semiconductor materials.

The bipolar junction transistor 70 includes the trench isolation regions 52, 53 and air gaps 58, 59 in the undercut beneath the intrinsic base 74, or the trench isolation regions 52, 53 that extend to occupy the undercut beneath the intrinsic base 74 as in FIG. 5A. Alternatively, the bipolar junction transistor 70 may include any of the trenches 36, 38 shaped as in FIGS. 4A-4C, which may be completely occupied by the trench isolation regions 52, 53 or may include gaps 58, 59 instead of dielectric material air in the undercut beneath the intrinsic base 74.

During the front-end-of-line (FEOL) portion of the fabrication process, the device structure of the bipolar junction transistor 70 is replicated across at least a portion of the surface area of the substrate 10. In BiCMOS integrated circuits, complementary metal-oxide-semiconductor (CMOS) transistors (not shown) may be formed using other regions of the substrate 10. As a result, both bipolar and CMOS transistors may be available on the same substrate 10.

Standard silicidation and standard middle-end-of-line (MEOL) and back-end-of-line (BEOL) processing follows, which includes formation of contacts and wiring for the local interconnect structure overlying the bipolar junction transistor 70, and formation of dielectric layers, via plugs, and wiring for an interconnect structure coupled by the interconnect wiring with the bipolar junction transistor 70, as well as other similar contacts for additional device structures like bipolar junction transistor 70 and CMOS transistors (not shown) included in other circuitry fabricated on the substrate 10. Other active and passive circuit elements, such as diodes, resistors, capacitors, varactors, and inductors, may be integrated into the interconnect structure and available for use in the BiCMOS integrated circuit.

The trench isolation regions 52, 53 either in combination with air gaps 58, 59 or in combination with dielectric-filled portions 47, 48 function as secondary trench isolation and operate in conjunction with the trench isolation regions 12, 13 functioning as the primary trench isolation. The trench isolation regions 52, 53 and the dielectric-filled portions 47, 48 or air gaps 58, 59 may have a dielectric constant that is less than the dielectric constant of the dielectric material of trench isolation regions 12, 13. The air gaps 58, 59 of unitary dielectric constant or, alternatively, portions 47, 48 of the trench isolation regions 52, 53 are located beneath the contact region between the extrinsic base 72 and intrinsic base 74. The reduction in the dielectric constant in the extrinsic device region beneath the intrinsic/extrinsic base contact area and outside of the intrinsic device region may operate to improve device performance by reducing the collector-to-base parasitic capacitance (Ccb). The unitary dielectric constant of air gaps 58, 59 would provide a lower Ccb than the portions 47, 48 of dielectric material in the lateral extensions 44, 45. The trench isolation regions 52, 53 may eliminate possible shorting of the extrinsic base 72 to the collector 18 because the trenches 36, 38 are initially etched through the shallow trench isolations 12, 13 and do not overlap with the collector 18.

The extrinsic region of the junction 78 is accessed by initially etching the trenches 36, 38 into the primary trench isolation regions 12, 13 at the edge of the active device region 14 and around the perimeter of the active device region 14, which is accomplished without etching through the active device region 14 or the single crystal section 24 of the intrinsic base layer 22. The trenches 36, 38 penetrate through the field section 25 of the intrinsic base layer 22 that is comprised of polycrystalline material. The lateral extensions 44, 45 of the trenches 36, 38 are formed in a self-aligned manner relative to the trench isolation regions 12, 13 by selectively etching the semiconductor material of the device region 14 (specifically, the collector 18) relative to the trench isolation regions 12, 13 and intrinsic base layer 22. The trenches 36, 38 and trench isolation regions 52, 53 are formed after the intrinsic base layer 22 is formed and before the extrinsic base layer 62 is formed. The formation of the lateral extensions 44, 45 reduces or removes the extrinsic region of the collector-base junction 78 without affecting the contact area between the extrinsic base layer 62 and intrinsic base layer 22, which contributes to a low base resistance (Rb).

Figure 9:
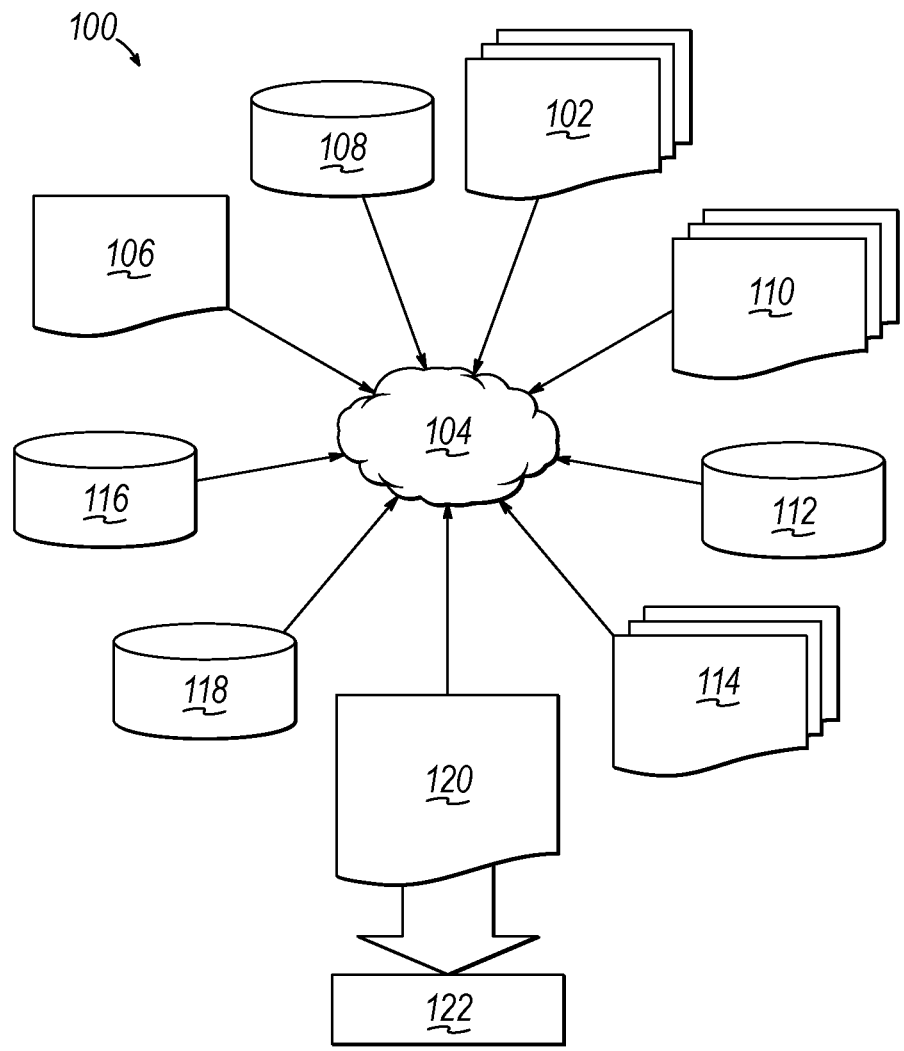
FIG. 9 is a flow diagram of a design process used in semiconductor design, manufacture, and/or test.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-8. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-8. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-8 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 120 may comprise a compiled, executable HDL simulation model that functionally simulates the devices shown in FIGS. 1-8.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor formed using a substrate, the device structure comprising:
   a first isolation region defining a boundary of an active device region in the substrate;
   an intrinsic base on the active device region of the substrate;
   a collector in the active device region;
   an emitter coupled by the intrinsic base with the collector; and
   a second isolation region at least partially inside the first isolation region, the second isolation region being coextensive with a portion of the first isolation region, and the second isolation region being coextensive with a portion of the active device region,
   wherein the second isolation region is adjacent to the active device region, and the first isolation region includes a portion that separates the second isolation region from a portion of the substrate beneath the first isolation region.

2. The device structure of claim 1 wherein the first isolation region is comprised of a first dielectric material, and the second isolation region is comprised of a second dielectric material having a lower dielectric constant than the first dielectric material.

3. The device structure of claim 1 wherein the second isolation region extends to a shallower depth relative to a top surface of the substrate than the first isolation region.

4. The device structure of claim 1 wherein the intrinsic base includes a section comprised of single crystal semiconductor material coextensive with a portion of the substrate in the active device region and a facet comprised of polycrystalline semiconductor material positioned at a periphery of the section.

5. The device structure of claim 1 wherein the second isolation region does not penetrate through the first isolation region and into the substrate beneath the first isolation region.

6. The device structure of claim 1 wherein at least two of the collector, the emitter, and the intrinsic base are comprised of different semiconductor materials.

7. A device structure for a bipolar junction transistor formed using a substrate, the device structure comprising:
   a first isolation region defining a boundary of an active device region in the substrate;
   an intrinsic base on the active device region;
   a collector in the active device region;
   an emitter coupled by the intrinsic base with the collector;
   a second isolation region at least partially inside the first isolation region, the second isolation region being coextensive with a portion of the first isolation region; and
   an air gap disposed between the second isolation region and the active device region of the substrate, the air gap coextensive with a portion of the intrinsic base, and the air gap is coextensive with a portion of the active device region,
   wherein the second isolation region is adjacent to the active device region, and the first isolation region includes a portion that separates the second isolation region from a portion of the substrate beneath the first isolation region.

8. The device structure of claim 7 wherein the air gap is coextensive with a portion of the second isolation region.

9. The device structure of claim 7 wherein the first isolation region is comprised of a first dielectric material, and the second isolation region is comprised of a second dielectric material having a lower dielectric constant than the first dielectric material.

10. The device structure of claim 7 wherein the second isolation region extends to a shallower depth relative to a top surface of the substrate than the first isolation region.

11. The device structure of claim 7 wherein the intrinsic base includes a section comprised of single crystal semiconductor material coextensive with a portion of the substrate in the active device region and a facet comprised of polycrystalline semiconductor material positioned at a periphery of the section.

12. The device structure of claim 7 wherein the second isolation region does not penetrate through the first isolation region and into the substrate beneath the first isolation region.

13. The device structure of claim 7 wherein at least two of the collector, the emitter, and the intrinsic base are comprised of different semiconductor materials.

* * * * *